(12) United States Patent
Matsuoka

(10) Patent No.: US 12,155,366 B2
(45) Date of Patent: Nov. 26, 2024

(54) SURFACE ACOUSTIC WAVE DEVICE

(71) Applicant: NDK SAW Devices Co., Ltd., Hokkaido (JP)

(72) Inventor: Naoto Matsuoka, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 638 days.

(21) Appl. No.: 17/344,988

(22) Filed: Jun. 11, 2021

(65) Prior Publication Data

US 2021/0408997 A1 Dec. 30, 2021

(30) Foreign Application Priority Data

Jun. 30, 2020 (JP) ................. 2020-113124

(51) Int. Cl.
*H03H 9/02* (2006.01)
(52) U.S. Cl.
CPC .... *H03H 9/02992* (2013.01); *H03H 9/02559* (2013.01)
(58) Field of Classification Search
CPC ........... H03H 9/02992; H03H 9/02559; H03H 9/02574; H03H 9/14541; H03H 9/14532; H03H 9/25; H03H 9/145
USPC .......................................... 333/133, 193–196
See application file for complete search history.

(56) References Cited

U.S. PATENT DOCUMENTS

2018/0054179 A1\* 2/2018 Gamble .................. H03H 3/10
2020/0162052 A1\* 5/2020 Matsuoka ................ H03H 9/25

FOREIGN PATENT DOCUMENTS

| JP | 2007081469 A | * | 3/2007 |
| JP | 5503020 | | 5/2014 |
| JP | 2020088459 | | 6/2020 |
| WO | 2018088188 | | 5/2018 |
| WO | 2020100949 | | 5/2020 |

OTHER PUBLICATIONS

Machine English Translation of JP-2007081469-A Published on Mar. 29, 2007 (Year: 2007).*
"Notice of Reasons for Refusal of Japan Counterpart Application", issued on Nov. 14, 2023, with English translation thereof, p. 1-p. 8.

\* cited by examiner

*Primary Examiner* — Rakesh B Patel
*Assistant Examiner* — Jorge L Salazar, Jr.
(74) *Attorney, Agent, or Firm* — JCIPRNET

(57) ABSTRACT

A surface acoustic wave device includes a piezoelectric substrate and a pair of IDT electrodes. The pair of IDT electrodes includes a pair of busbars and multiple electrode fingers. The pair of busbars are formed on the piezoelectric substrate. The electrode fingers extend in a comb shape from each of the busbars toward the opposing busbar. The pair of IDT electrodes has an intersection region as a region where the electrode fingers connected to one busbar and the electrode fingers connected to another busbar are intersected when viewed along an arrangement direction of the electrode fingers. The electrode finger in a non-intersection region outside the intersection region has a thickness thinner than a thickness of the electrode finger in the intersection region.

9 Claims, 11 Drawing Sheets

SURFACE ACOUSTIC WAVE DEVICE

CROSS-REFERENCE TO RELATED APPLICATIONS

This application is based on and claims priority under 35 U.S.C. § 119 to Japanese Patent Application No. 2020-113124, filed on Jun. 30, 2020, the entire content of which is incorporated herein by reference.

TECHNICAL FIELD

This disclosure relates to a surface acoustic wave device that converts a frequency signal into a surface acoustic wave.

DESCRIPTION OF THE RELATED ART

A resonator for configuring a filter or a duplexer that is used in a wireless communication and has a wide band and steep transition property has been developed. For example, a Temperature Compensated-Surface Acoustic Wave (TC-SAW) element that uses $LiNbO_3$ as a piezoelectric substrate and includes a temperature compensation film made of, for example, silicon dioxide on a surface of the piezoelectric substrate is known to have a small fluctuation in properties in association with temperature changes and to obtain a relatively high Q-value.

Meanwhile, in order to deal with the continuously increasing communication traffic, a property that has a further wideband and steep transition property and is low in loss is desired for the duplexer and the filter. In responding such a need, the Q-value of a SAW configuring a resonator is one of the important indicators and various examinations for improving this have been performed.

Japanese Patent No. 5503020 discloses an electroacoustic transducer in which for regions between two busbars disposed in an opposed manner, five regions of the central excitation region where electrode fingers are intersected, inner edge regions on both sides of the central excitation region, and outer edge regions on both sides thereof along a direction in which the busbars extend. This electroacoustic transducer is in a configuration of operating in a piston mode with a high Q-value and a reduced spurious response by increasing or decreasing widths of the electrode fingers positioned in the inner edge regions.

WO 2018/088188 A1 discloses an elastic wave device in which an intersection region of first electrode fingers and second electrode fingers as IDT electrodes is divided into a central portion and low acoustic velocity portions on both sides of the central portion and central portion electrode finger are made thicker than the low acoustic velocity portions.

However, none of Japanese Patent No. 5503020 or WO 2018/088188 A1 discloses a technique related to features of these electrode fingers outside the region where the electrode fingers connected to the busbars are intersected.

A need thus exists for a surface acoustic wave device which is not susceptible to the drawback mentioned above.

SUMMARY

According to an aspect of this disclosure, there is provided a surface acoustic wave device that includes a piezoelectric substrate and a pair of IDT electrodes (Interdigital transducer electrodes). The pair of IDT electrodes includes a pair of busbars and a plurality of electrode fingers. The pair of busbars are formed on the piezoelectric substrate. The plurality of electrode fingers extends in a comb shape from each of the busbars toward the opposing busbar. The pair of IDT electrodes has an intersection region as a region where the electrode fingers connected to one busbar and the electrode fingers connected to another busbar are intersected when viewed along an arrangement direction of the plurality of electrode fingers. The electrode finger in a non-intersection region outside the intersection region has a thickness thinner than a thickness of the electrode finger in the intersection region.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
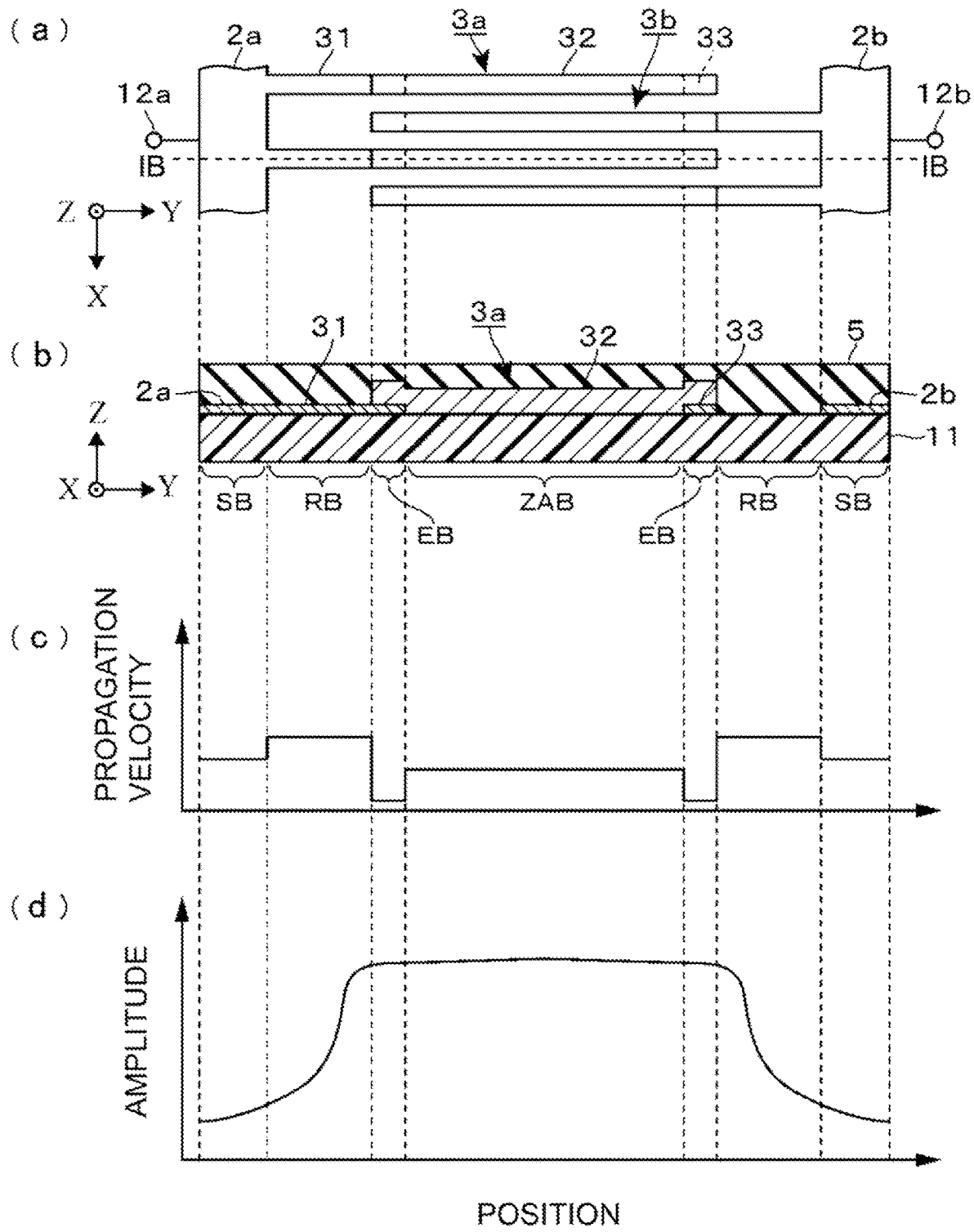
In FIG. 1, (a) to (d) illustrate a configuration of a SAW device according to a first embodiment.

In FIG. 1, (a) to (d) illustrate a basic configuration of a surface acoustic wave device (SAW device) according to a first embodiment. The diagrams illustrate an exemplary configuration of a SAW device that is configured as a Temperature Compensate (TC)-SAW device having a temperature compensation function and that operates in a piston mode as an exemplary confinement mode.

(a) of FIG. 1 is an enlarged plan view enlarging and schematically illustrating a part of IDT electrodes disposed in the SAW device, and (b) of FIG. 1 is a longitudinal sectional side view of the SAW device at a position indicated by the dashed line IB-IB in (a) of FIG. 1. Furthermore, (c) of FIG. 1 is a distribution diagram of a propagation velocity of a SAW viewed along a Y-axis direction illustrated in (a) of FIG. 1, and (d) of FIG. 1 is a distribution diagram of amplitude of the SAW viewed along the identical direction.

The SAW device in this example includes IDT electrodes formed on a rectangular piezoelectric substrate 11 that excites the SAW. In the following description, a direction along a long side of the rectangular piezoelectric substrate 11 (however, an illustration of a planar shape is omitted) is also referred to as a longitudinal direction (an X-direction in (a) of FIG. 1), and a direction along a short side is also referred to as a lateral direction (a Y-direction in the identical drawing).

The IDT electrodes are disposed, for example, to extend in the longitudinal direction along respective long sides of the piezoelectric substrate 11. The IDT electrodes include two busbars 2a and 2b connected to respective signal ports 12a and 12b, and a large number of electrode fingers 3a and 3b formed to extend in the lateral direction from the respective busbars 2a and 2b.

A case where, for example, lithium niobate ($LiNbO_3$), lithium tantalate ($LiTaO_3$), aluminum nitride (AlN), scandium (Sc)-doped aluminum nitride, or the like is used as a piezoelectric material that constitutes the piezoelectric substrate 11 can be exemplified.

The piezoelectric substrate 11 according to the embodiment includes: (i) one where a piezoelectric thin film is formed on a surface of a substrate made of a non-piezoelectric material, and (ii) a stacked substrate where a non-piezoelectric material and a piezoelectric material are stacked. As (i), a case where the piezoelectric thin film of the aluminum nitride is formed on a surface of a sapphire substrate as the non-piezoelectric material can be exemplified. As (ii), a stacked substrate where a silicon substrate as the non-piezoelectric material and a $LiTaO_3$ substrate as the piezoelectric material are stacked can be exemplified.

When the $LiNbO_3$ is used as the piezoelectric material, as a cut angle of the $LiNbO_3$ in an Euler angle ($\phi$, $\theta$, $\psi$) notation, one where $\phi$, $\psi=0°\pm10°$, and $\theta=38°\pm10°$, one where $\phi$, $\psi=0°\pm10°$, and $\theta=-85°\pm15°$, one where $\phi$, $\psi=0°\pm10°$, and $\theta=131°\pm15°$, or one where $\theta=0°\pm10°$, and $0=-90°\pm10°$, and $\psi=-90°\pm10°$ can be exemplified.

When the $LiTaO_3$ is used as the piezoelectric material, as a cut angle of the $LiTaO_3$ in the Euler angle ($\phi$, $\theta$, $\psi$) notation, one where $\phi$, $\psi=0°\pm10°$, and $\theta=132°\pm15°$ or one where $\theta$, $\psi=0°\pm10°$, and $\theta=-90°\pm15°$ can be exemplified.

As illustrated in (a) of FIG. 1, the electrode fingers 3a connected to one busbar 2a are disposed to extend toward a side of the busbar 2b arranged at an opposed position. The electrode fingers 3b connected to the other busbar 2b are disposed to extend toward the one busbar 2a. When viewed along an arranged direction of the electrode fingers 3a and 3b, the electrode fingers 3a connected to the one busbar 2a and the electrode fingers 3b connected to the other busbar 2b are alternately arranged in an intersecting manner.

As described above, a region where the electrode fingers 3a and 3b are arranged in an intersecting manner corresponds to an intersection region of the IDT electrode. Distal end portions of the electrode fingers 3a or 3b connected to one busbar 2a or 2b do not reach the other busbar 2b or 2a. Thus, two regions where the electrode fingers 3a and 3b do not intersect are formed on the respective busbars 2a and 2b sides viewed from the intersection region. These regions are equivalent to non-intersection regions (also referred to as "gap regions" in some cases) RB.

Furthermore, the above-described intersection region includes two end portion regions EB as regions including end portions of these electrode fingers 3a and 3b. In (a) and (b) of FIG. 1, and (a) and (b) of FIG. 2, in the intersection region, a region excluding these end portion regions EB is attached by a reference numeral "ZAB" (the same applies to (a) and (b) of FIG. 5, (a) and (b) of FIG. 6, and (a) and (b) of FIG. 9 described below).

Two regions where the respective busbars 2a and 2b are formed are also referred to as busbar regions SB.

In the SAW device in the first embodiment including the above-described configuration, the respective electrode fingers 3a and 3b are configured to have thicknesses of the electrode fingers 3a and 3b in the non-intersection regions RB thinner than thicknesses of the electrode fingers 3a and 3b in the intersection region ZAB.

As a method for changing the thicknesses of the electrode fingers 3a and 3b in accordance with the formation regions (the intersection region ZAB, the non-intersection regions RB), for example, the SAW device illustrated in (a) to (d) of FIG. 1 has a configuration in which the electrode fingers 3a and 3b are formed by connecting first electrode finger films 31 and second electrode finger films 32 having different thicknesses from one another.

At this time, increasing the thickness of the second electrode finger film 32 disposed in the intersection region ZAB to be larger than that of the first electrode finger film 31 disposed in the non-intersection region RB (decreasing the thickness of the first electrode finger film 31 to be smaller than that of the second electrode finger film 32) ensures configuring the electrode fingers 3a and 3b having the configuration illustrated in (a) and (b) of FIG. 1. The reason why making the thicknesses of the first electrode finger film 31 and the second electrode finger film 32 mutually different will be described later.

Furthermore, in the IDT electrode illustrated in (a) and (b) of FIG. 1, the SAW device is operated in the piston mode as a confinement mode, and therefore, in the two end portion regions EB, there are provided low acoustic velocity regions in which a propagation velocity of the SAW is slower than in the intersection region ZAB positioned inside the two end portion regions EB.

As a specific method to cause the end portion regions EB to be the low acoustic velocity regions, the above-described first electrode finger film 31 and second electrode finger film 32 are stacked in a vertical direction and connected. At a distal end portion of the second electrode finger film 32, which is disposed on the opposite side of the connection position between these electrode finger films 31 and 32, a propagation velocity adjusting film 33 for increasing the thicknesses of the electrode fingers 3a and 3b is disposed.

In operating the SAW device in the confinement mode, the usage of the piston mode is not a necessary requirement.

In the following description, in the first electrode finger films 31, end portions at one side connected to the busbars 2a and 2b are referred to as base portions and end portions at the opposite side of the base portions are referred to as distal end portions. In the second electrode finger films 32, end portions at one side connected to the first electrode finger films 31 are referred to as base portions and end portions at the opposite side of the base portions are referred to as distal end portions.

At this time, the SAW device illustrated in (a) and (b) of FIG. 1 has the distal end portions of the first electrode finger films 31 and the base portions of the second electrode finger films 32 stacked in the vertical direction and connected, and the stacked portions are disposed in the above-described end portion regions EB. The distal end portions of the second electrode finger films 32 are stacked on the propagation velocity adjusting films 33 for decreasing the propagation velocity of the SAW to be a low speed by increasing the thicknesses of the distal end portions of the electrode fingers 3a and 3b, and the portions on which the second electrode finger films 32 are stacked are disposed in the end portion regions EB.

Thus, in the end portion regions EB disposed at both sides of the intersection region ZAB, stacked structures of the distal end portions of the first electrode finger films 31 and the base portions of the second electrode finger films 32 or the distal end portions of the second electrode finger films 32 and the propagation velocity adjusting films 33 are disposed to form a region having the thicknesses of the electrode fingers 3a and 3b thicker than those in the intersection region ZAB. As a result, the propagation velocity of the SAW in the end portion regions EB can be decreased to a speed lower than the propagation velocity of the SAW in the intersection region ZAB. On the other hand, the thickness of the first electrode finger film 31 disposed in the non-intersection region RB is thinner than the thicknesses of the second electrode finger film 32 in the intersection region ZAB and the stacked portion in the end portion region EB, and therefore, the propagation velocity is in a higher speed than in these regions ZAB and EB.

The above-described configuration ensures forming a distribution of the propagation velocity of the SAW illustrated in (c) of FIG. 1, and as a result, it is possible to excite the SAW in the piston mode having the amplitude distribution illustrated in (d) of FIG. 1.

In the SAW device having the configuration illustrated in (a) and (b) of FIG. 1, materials of metal films of the first electrode finger film 31 and the propagation velocity adjusting film 33 may be selected so as to decrease densities of the first electrode finger film 31 and the propagation velocity adjusting film 33 to be smaller than that of the second electrode finger film 32.

For example, when aluminum (Al) is selected as a metal that constitutes the first electrode finger film 31 and the propagation velocity adjusting film 33, a case where platinum (Pt), copper (Cu), gold (Au), argentum (Ag), tungsten (W), molybdenum (Mo), cobalt (Co), iron (Fe), nickel (Ni), chrome (Cr), or tantalum (Ta) is selected as a metal that constitutes the second electrode finger film 32 can be exemplified.

When the metal that constitutes the first electrode finger film 31 and the propagation velocity adjusting film 33 is an alloy or a stacked structure made of two or more metals using a metal (a second metal) with densities smaller than that of the metal (a first metal) constituting the second electrode finger film 32, an effective density of the first electrode finger film may be reduced by containing 50% or more of the second metal in volume ratio as the main constituent material.

Furthermore, when a dielectric film 5 is formed in the SAW device as described below, use of a material having a density close to a density of the dielectric film 5 for the first electrode finger film 31 and the propagation velocity adjusting film 33 ensures obtaining an effect of weakening a reflection of the SAW in the first electrode finger film 31. As an example of such a material, a case where the first electrode finger film 31 and the propagation velocity adjusting film 33 are constituted of aluminum (Al) when the dielectric film 5 is constituted of silicon dioxide ($SiO_2$) can be exemplified.

While (a) of FIG. 1 omits the illustration, a foundation layer film made of titanium (Ti) and/or chrome (Cr) for improving adherability of these IDT electrodes may be disposed between the piezoelectric substrate 11 and the IDT electrodes (the busbars 2a and 2b, the electrode fingers 3a and 3b, and the like).

In addition to the configuration described above, the SAW device in this example may be configured as a TC-SAW device having a temperature compensation function that compensates an influence of frequency versus temperature characteristic of a piezoelectric material constituting the piezoelectric substrate 11 as illustrated in (a) of FIG. 1.

In the TC-SAW device, the dielectric film 5 is formed (in other words, "loaded") on an upper surface of the piezoelectric substrate 11 where the IDT electrodes (the busbars 2a and 2b and the electrode fingers 3a and 3b) are formed. In order to avoid a complicated illustration content, the illustration of the dielectric film 5 is omitted (a state where a lower surface side of the dielectric film 5 is seen through is illustrated) in the plan view of (a) of FIG. 1 and the like.

For the dielectric film 5 loaded on the TC-SAW device, one that has a frequency versus temperature characteristic opposite to that of the piezoelectric material of the piezoelectric substrate 11 is used. For example, when the piezoelectric material of the piezoelectric substrate 11 has a negative frequency versus temperature characteristic with which an excited frequency decreases in association with a temperature rise, the dielectric film 5 having a positive frequency versus temperature characteristic with which a frequency increases in association with a temperature rise is loaded. On the contrary, for the piezoelectric substrate 11 made of the piezoelectric material having a positive frequency versus temperature characteristic, the dielectric film 5 having a negative frequency versus temperature characteristic is loaded. Thus, loading the dielectric film 5 having the frequency versus temperature characteristic opposite to that of the piezoelectric substrate 11 ensures reducing an influence of temperature change around the SAW device.

For example, the above-described $LiNbO_3$ has a negative frequency versus temperature characteristic. Therefore, for the piezoelectric substrate 11 constituted of $LiNbO_3$, a case of loading the dielectric film 5 of silicon dioxide having a positive frequency versus temperature characteristic, silicon oxynitride (no special limit in stoichiometric ratio, and it may be SiNO or it may be $SiO_2$ doped with nitrogen), or silicon dioxide doped with fluorine can be exemplified. The dielectric film 5 made of these materials can be loaded by a method such as Chemical Vapor Deposition (CVD) and sputtering.

Causing the SAW device to have a temperature compensation function is not a necessary requirement. In this case, a surface of the piezoelectric substrate 11 may be covered with, for example, silicon nitride without piezoelectric property so as to be a protective film.

The above-described SAW device, in which the electrode fingers 3a and 3b are constituted of the first electrode finger film 31 and the second electrode finger film 32 having different thicknesses, the first electrode finger film 31 and the second electrode finger film 32 are stacked, and the second electrode finger film 32 and the propagation velocity adjusting film 33 are stacked in the end portion region EB, is manufactured. As a specific example, a case where they are separately formed can be exemplified.

For example, after forming a metal film having a predetermined film thickness made of aluminum on the upper surface of the piezoelectric substrate 11, the busbars 2a and 2b, the first electrode finger film 31, and the propagation velocity adjusting film 33 are patterned by etching or the like. Next, a copper metal film having a thickness thicker than that of the above-described metal film of aluminum is formed and patterned as the second electrode finger film 32 using a lift-off method or the like, such that the stacked portion in the end portion region EB remains on the upper surface of the piezoelectric substrate 11 on which the first electrode finger film 31, the propagation velocity adjusting film 33, and the like are patterned.

This ensures constituting the electrode fingers 3a and 3b by connecting the first electrode finger film 31 to the second electrode finger film 32 having a thickness thicker than that of the first electrode finger film 31. Disposing the stacked portions of the first electrode finger film 31 and the second electrode finger film 32, and the second electrode finger film 32 and the propagation velocity adjusting film 33 in the end portion region EB ensures forming the low acoustic velocity regions.

Other schematic design variables for the SAW device are indicated. A distance d between center lines of the electrode fingers 3a and 3b is set at λ/2 with respect to a wavelength λ corresponding to a design frequency of the SAW device. From the viewpoint of sufficiently confining an acoustic energy, a width dimension of the non-intersection region RB is preferred to be set at around 1.6d to 6d (0.8λ to 3λ) and preferably 2d to 4d (1λ to 2λ).

However, by forming the busbars 2a and 2b with, for example, the same metal film as that of the first electrode finger film 31 such that a high acoustic velocity region that confines the acoustic energy can be formed, the above-described restrictions are eliminated and it is also possible to set the width dimension of the non-intersection region RB at around 0.1d to 1d.

The following describes the reason why it is configured to cause the thicknesses of the electrode fingers 3a and 3b in the non-intersection region RB to be thinner than the thicknesses of the electrode fingers 3a and 3b in the intersection region ZAB by connecting the first electrode finger film 31 to the second electrode finger film 32 in the SAW device having the configuration described above.

The SAW device that operates in the piston mode illustrated in (c) of FIG. 1 basically ensures a uniform width of a waveguide. In view of this, compared with a method of apodization that is employed in the conventional SAW device and gradually changes a length of the electrode fingers, a small deterioration of effective electromechanical coupling coefficient is ensured and has an advantage of ensuring reduced spurious response.

Meanwhile, the non-intersection region RB plays a role of confining the SAW inside the IDT, and there are a few examination examples to optimize the configuration of the non-intersection region RB. Therefore, the inventor of this application has examined the structure of the non-intersection region RB appropriate for the SAW device that operates in the confinement mode including the piston mode.

When the piezoelectric material of the piezoelectric substrate 11 has a common protruding-shaped slowness curve, the SAW, which is excited in the intersection region ZAB in the IDT and is guided on the piezoelectric substrate 11, is reflected due to a difference in acoustic velocities when it enters the non-intersection region RB as a region with a fast acoustic velocity. As a result, the SAW can be confined within the intersection region ZAB of the IDT.

However, generally, when the wave motion is reflected by a structurally discontinuous portion, it is known that scattering occurs simultaneously with the reflection. Also, in the above-described SAW device, the occurrence of scattering when the SAW is reflected by the non-intersection region RB leads to an increased acoustic loss of the SAW device.

Therefore, the inventor focused on the thicknesses of the electrode fingers 3a and 3b in the non-intersection region RB. Decreasing the thicknesses of the electrode fingers 3a and 3b in this region ensures reduced structural differences between the region where the electrode fingers 3a and 3b are disposed and the region where the electrode fingers 3a and 3b are not disposed in the non-intersection region RB.

As a result, structural symmetry of the non-intersection region RB is increased, and therefore, it is considered that this structure reduces the scattering when the SAW enters the non-intersection region RB, thereby ensuring configuring a SAW device with low loss.

In order to verify validity of the design concept described above, a model of the SAW device in the configuration described using (a) and (b) of FIG. 1 was fabricated and a characteristic analysis was performed by a Finite Element Method (FEM).

The following lists the design variables: a pitch of the IDT of 4 μm; a width of the intersection region ZAB of 51.4 μm; a width of the end portion region EB of 2.6 μm; a width of the non-intersection region RB of 13 μm; an electrode material of the first electrode finger film 31 and the second electrode finger film 32 of copper (Cu); a thickness of the first electrode finger film 31 and the propagation velocity adjusting film 33 of 88 nm; and a thickness of the second electrode finger film 32 of 260 nm. As the dielectric film 5, silicon dioxide ($SiO_2$) having a thickness of 1.4 μm was loaded. The piezoelectric material of the piezoelectric substrate 11 is $LiNbO_3$ in 126.5 XY-cut (in Euler angle notation, (φ, θ, ψ)=(0°, 36.5°, 0°)).

Figure 2:
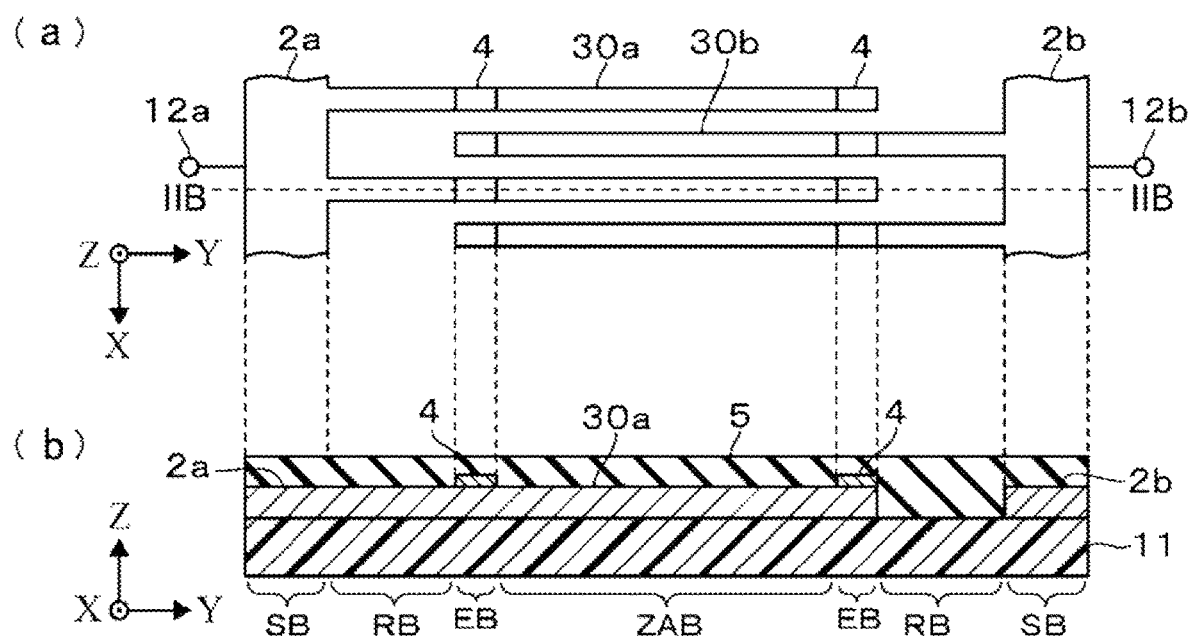
In FIG. 2, (a) and (b) illustrate a configuration of a SAW device according to a comparative configuration.

As a comparative configuration with respect to this, a model of the SAW device, which has the configuration illustrated in (a) and (b) of FIG. 2 including electrode fingers 30a and 30b with a uniform thickness, is fabricated and a similar FEM analysis was performed. The design variables are the same as those of the SAW device according to the first embodiment illustrated in (a) and (b) of FIG. 1 except that the thickness of the electrode fingers 30a and 30b are 260 nm and constant, and except that the end portion region EB is made to be a low acoustic velocity region by disposing the propagation velocity adjusting film 33 of copper having a thickness of 88 nm on upper surfaces of the electrode fingers 30a and 30b.

Figure 3:
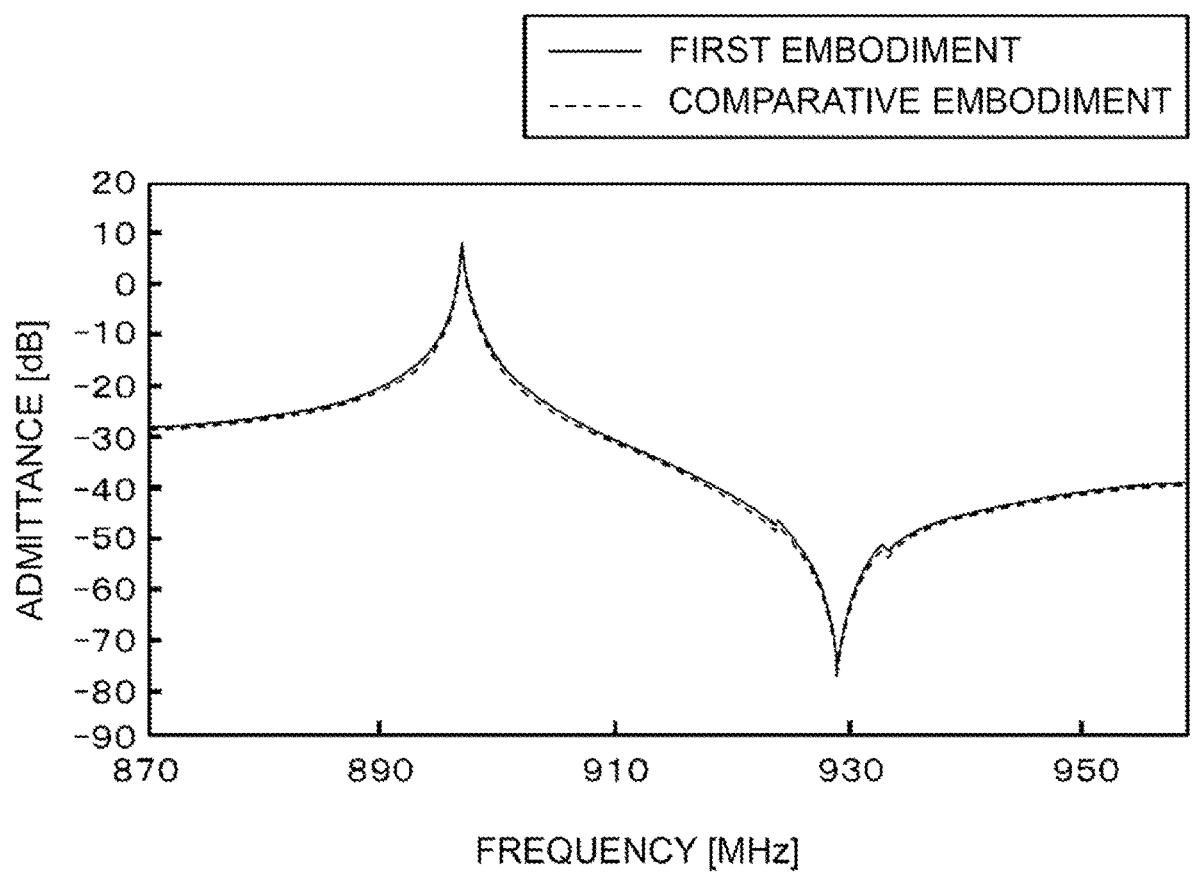
FIG. 3 is a frequency-admittance characteristic diagram of the SAW devices according to the first embodiment and the comparative configuration.
Figure 4:
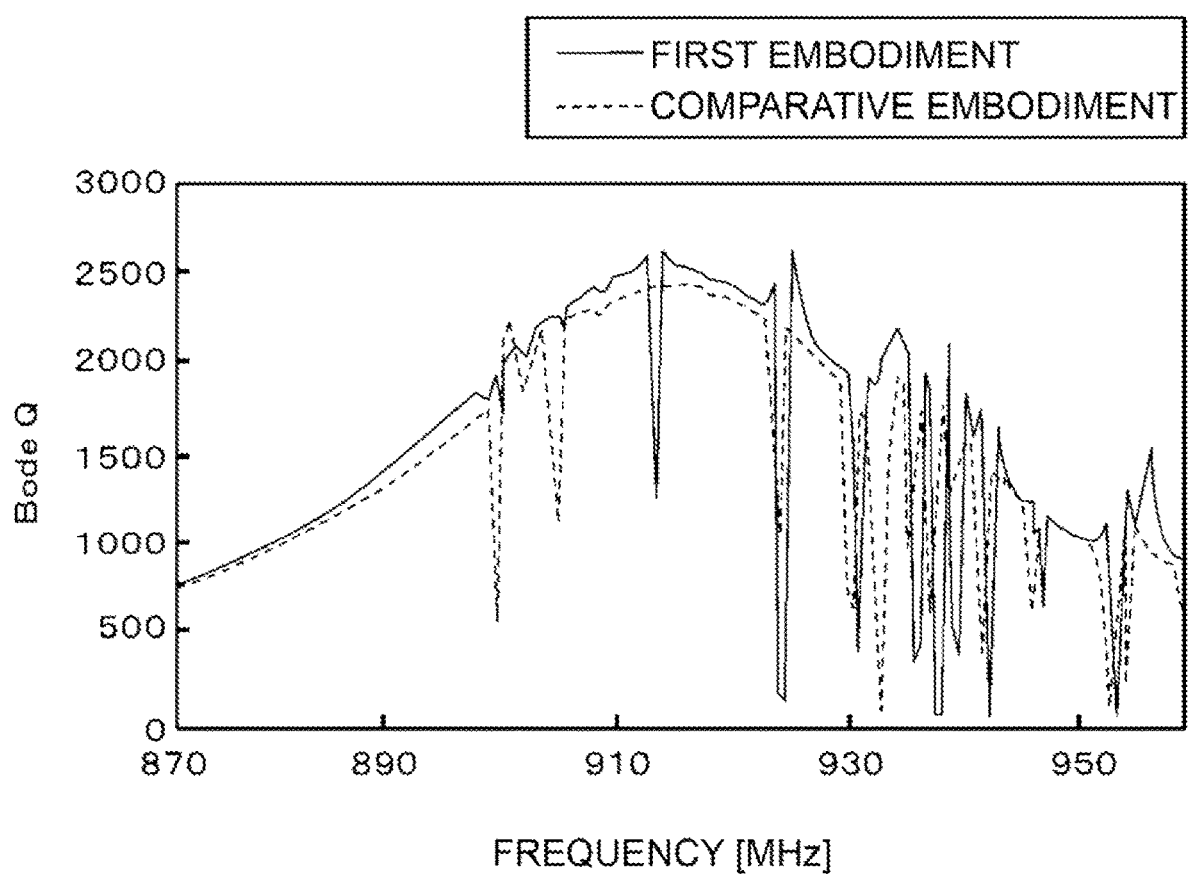
FIG. 4 is a frequency-Bode Q-value characteristic diagram of the SAW devices according to the first embodiment and the comparative configuration.

The results of the FEM analyses on the SAW devices according to the first embodiment and the comparative configuration are illustrated in FIG. 3 and FIG. 4.

FIG. 3 illustrates changes in admittance with respect to frequency changes of the SAWs, and FIG. 4 illustrates changes in Bode Q as one kind of Q-values with respect to frequency changes of the SAWs.

The Bode Q is calculated based on the following formula (1).

$$\text{Bode } Q = (\omega|S11|\text{group\_delay}(S11))/(1-|S11|^2) \quad (1)$$

Here, ω|S11| is an angular frequency of a reflection coefficient S11 of the SAW device, group_delay(S11) is a group delay of the reflection coefficient S11, and |S11| is an amplitude of the reflection coefficient S11.

According to the results illustrated in FIG. 3, it was confirmed that the SAW device according to the first embodiment showed an admittance characteristic approximately equal to that of the SAW device according to the comparative configuration as the conventional configuration, and obtained a satisfactory characteristic with a reduced spurious response.

Meanwhile, regarding the Bode Q-values in FIG. 4, the maximum values were approximately 2400 in the SAW device according to the comparative configuration, whereas approximately 2500 in the SAW device according to the first embodiment. Thus, the SAW device according to the first embodiment saw an improvement in Bode Q by approximately 100 compared with the conventional configuration, and therefore, it can be said that it is a SAW device with low loss.

The SAW device in this embodiment has the following effects. In a pair of IDT electrodes disposed on the piezoelectric substrate 11, the thicknesses of the electrode fingers 3a and 3b in the non-intersection region RB outside the intersection region ZAB are configured to be thinner than the thicknesses of the electrode fingers 3a and 3b in the intersection region ZAB, thereby reducing a loss associated with the scattering of SAW to ensure further increasing the Q-value.

Figure 5:
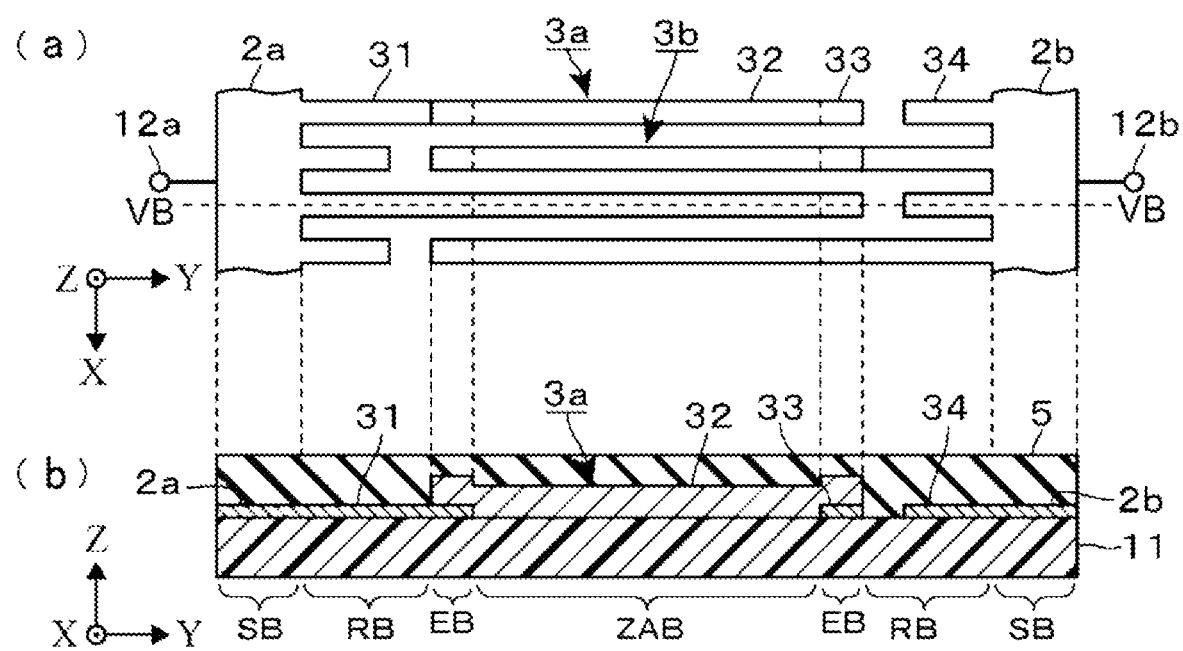
In FIG. 5, (a) and (b) illustrate a configuration of a SAW device including dummy electrode fingers.
Figure 6:
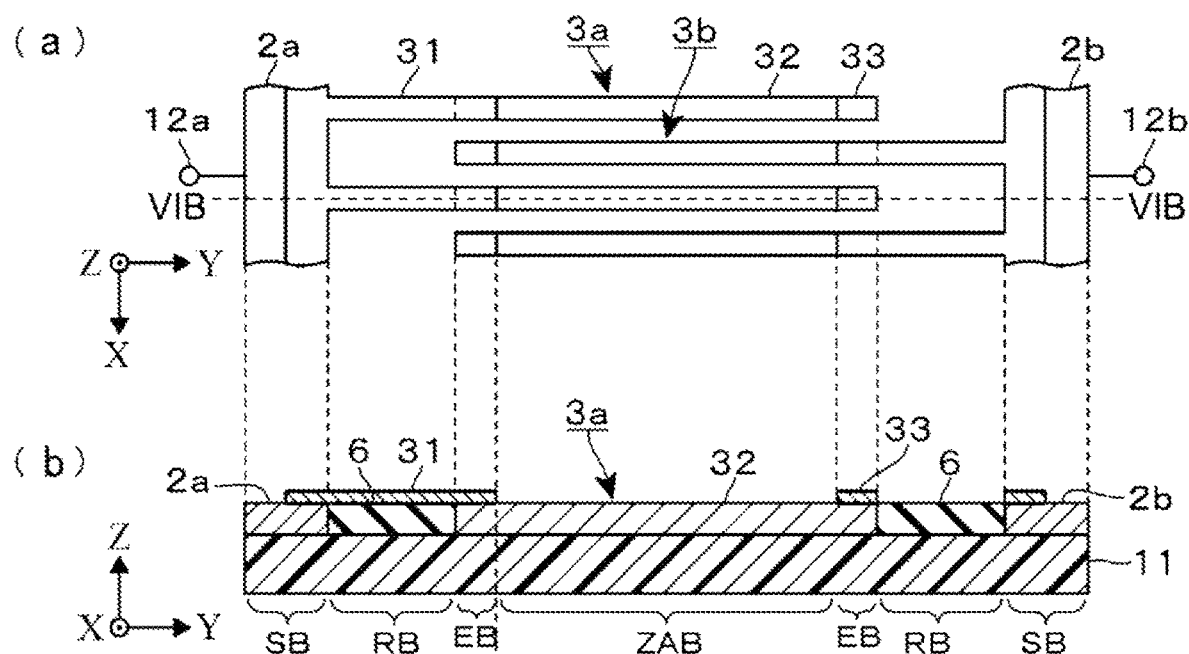
In FIG. 6, (a) and (b) illustrate a configuration of a SAW device according to a second embodiment.
Figure 9:
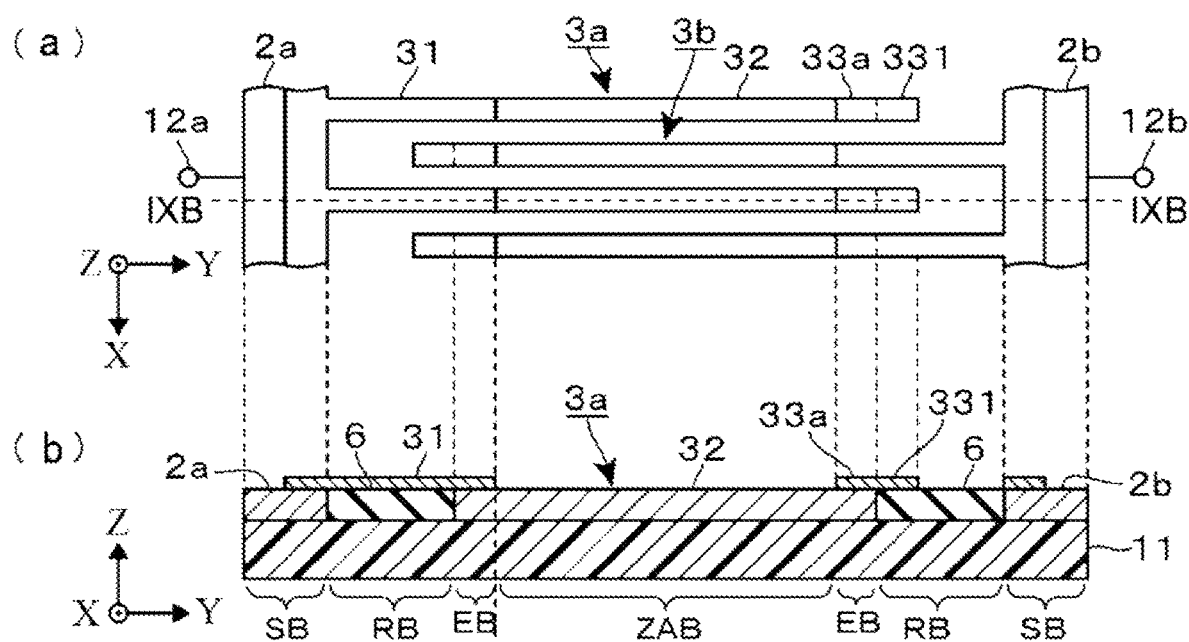
In FIG. 9, (a) and (b) illustrate a configuration of a SAW device according to a third embodiment.

Here, as illustrated in (a) and (b) of FIG. 5, in the non-intersection region RB of the SAW device in this example, a plurality of dummy electrode fingers 34 may be formed for each of the busbars 2a and 2b between end portions of a plurality of the electrode fingers 3a or 3b connected to one of the busbars 2a and 2b and the other of the busbars 2b and 2a (the same applies to SAW devices illustrated in (a) and (b) of FIG. 6, and (a) and (b) of FIG. 9). The plurality of dummy electrode fingers 34 are away from the end portions of the plurality of electrode fingers 3a or 3b and extend from the other of the busbars 2b and 2a.

At this time, a thickness of the dummy electrode finger 34 disposed in the non-intersection region RB is preferred to be thinner than the thickness (in the example illustrated in (a) and (b) of FIG. 5, the thickness of the second electrode finger film 32) of the electrode fingers 3a and 3b in the intersection region ZAB. This ensures forming a region with a high acoustic velocity in the intersection region ZAB and periodicity of the structure can also be made equal to that of the intersection region ZAB.

When the dummy electrode finger 34 is made thicker than the thickness of the electrode fingers 3a and 3b in the intersection region ZAB, the reflection occurs also when the elastic wave enters in a region with a different acoustic velocity, thereby ensuring further effectively confining the elastic wave within the intersection region ZAB.

Next, a configuration of the SAW device according to a second embodiment illustrated in (a) and (b) of FIG. 6 are described. In the SAW device according to the second embodiment, the distal end portions of the first electrode finger films 31 are stacked on upper surfaces of the base portions of the second electrode finger films 32, and the propagation velocity adjusting films 33 are stacked on upper surfaces of the distal end portions of the second electrode finger films 32. This is different from the SAW device according to the first embodiment in which each of the distal end portions of the first electrode finger films 31 and the propagation velocity adjusting films 33 is stacked on the lower surface side of the second electrode finger films 32.

More specifically, in regions other than the formation regions of the second electrode finger films 32 on the piezoelectric substrate 11, a support film 6, made of, for example, silicon dioxide (SiO$_2$) dielectric material, as a temperature compensation film is formed. The first electrode finger films 31 are configured to be formed on an upper surface side of this support film 6 and to connect the busbars 2a and 2b to the second electrode finger films 32 in a bridging manner. At this time, the distal end portions of the first electrode finger films 31 are in a state of being stacked on the upper surface sides of the base portions of the second electrode finger films 32.

The propagation velocity adjusting films 33 are directly stacked on the upper surface sides of the distal end portions of the second electrode finger films 32. Protective films made of, for example, silicon nitride may be disposed on the upper surface sides of the first electrode finger films 31 and the propagation velocity adjusting films 33.

For example, when the first electrode finger film 31 is directly disposed in the non-intersection region RB on the piezoelectric substrate 11, there possibly occurs a loss associated with an occurrence of a faint excitation in association with the first electrode finger film 31 being in contact with the base portion of the second electrode finger film 32.

In contrast, as the second embodiment illustrated in (a) and (b) of FIG. 6, disposing the first electrode finger film 31 on the support film 6 made of a dielectric material without a piezoelectric property reduces the above-described faint excitation, and possibly ensures achieving a further reduction in loss.

Figure 7:
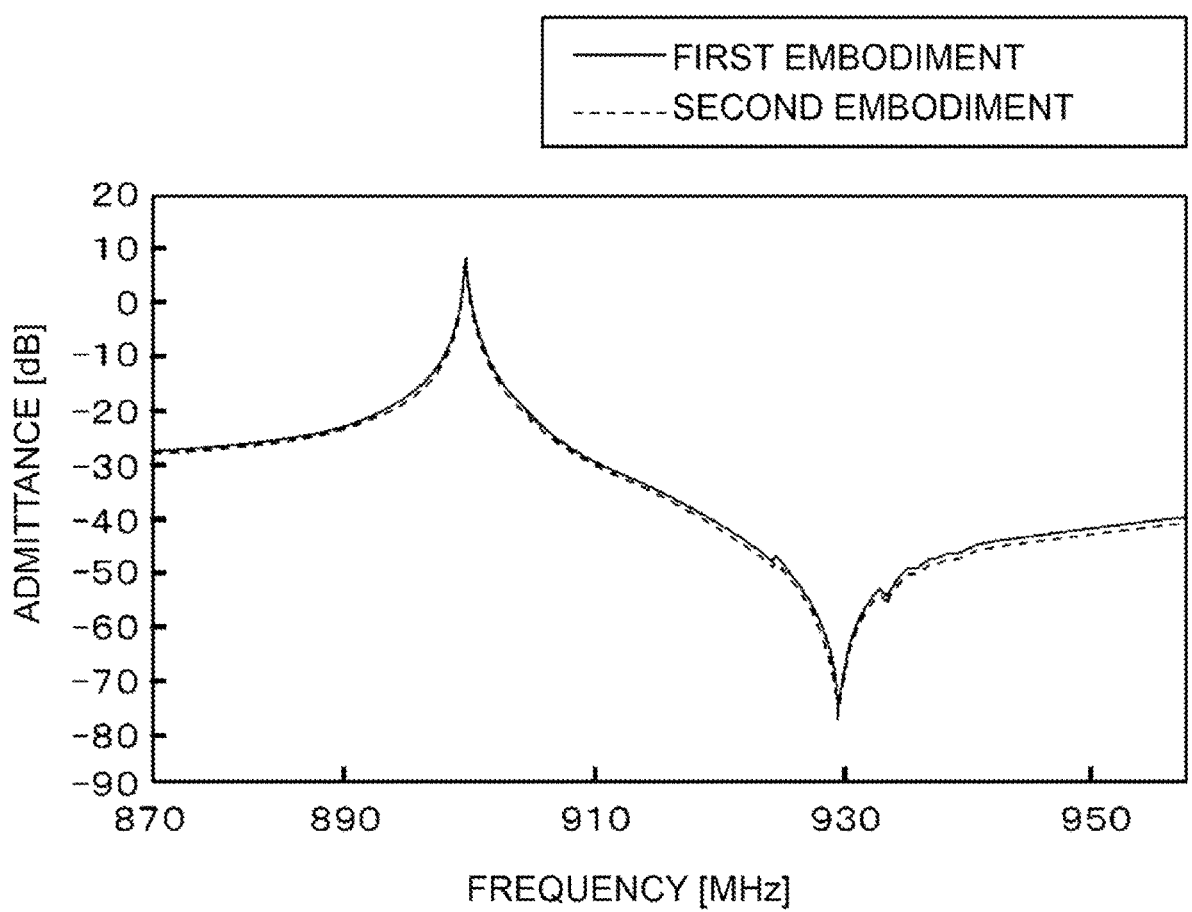
FIG. 7 is a frequency-admittance characteristic diagram of the SAW devices according to the first embodiment and the second embodiment.
Figure 8:
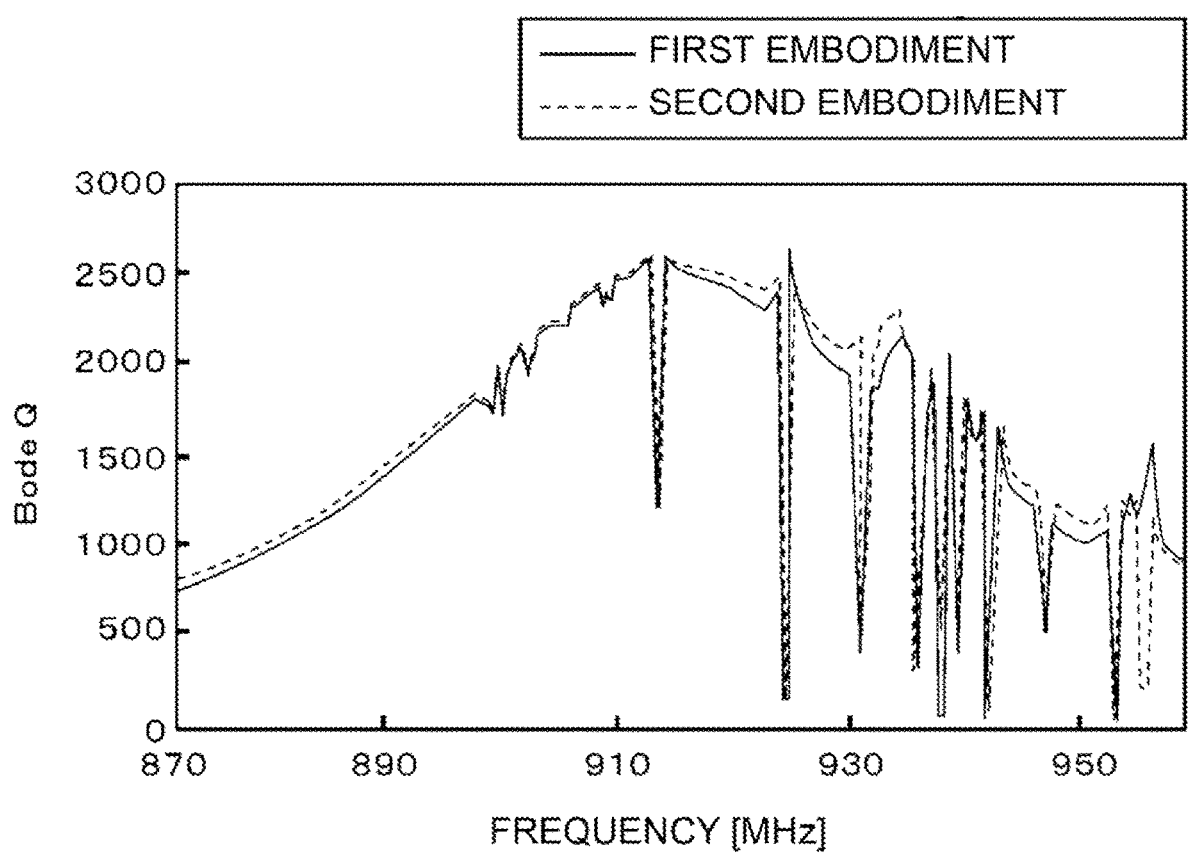
FIG. 8 is a frequency-Bode Q-value characteristic diagram of the SAW devices according to the first embodiment and the second embodiment.

FIG. 7 and FIG. 8 illustrate comparisons of characteristics between a model of the SAW device according to the second embodiment and the SAW device according to the first embodiment by creating the model of the SAW device according to the second embodiment and performing the FEM analysis on it.

Except for configurational differences illustrated in (a) and (b) of FIG. 6, each of the design variables is the same as those in the simulation model of the first embodiment.

According to the results illustrated in FIG. 7, it was confirmed that the SAW device according to the second embodiment showed an admittance characteristic approximately equal to that of the SAW device according to the first embodiment described above, and obtained a satisfactory characteristic with a reduced spurious response.

The Bode Q-values in FIG. 8 also had their maximum values of approximately 2500 in both the SAW devices of the first and second embodiments in the FEM analyses. Thus, the SAW device according to the second embodiment has a characteristic similar to that of the SAW device according to the first embodiment, and has a characteristic having a low loss compared with the SAW device according to the conventional configuration described using (a) and (b) of FIG. 2 to FIG. 4.

Next, a SAW device according to a third embodiment illustrated in (a) and (b) of FIG. 9 has a configuration in which extending portions 331 for achieving an improved electromechanical coupling coefficient of the IDT electrodes are disposed in the SAW device according to the second embodiment described using (a) and (b) of FIG. 6.

That is, this SAW device includes the extending portions 331 formed by extending propagation velocity adjusting films 33a toward on the support film 6 on the non-intersection region RB sides.

Disposing the extending portions 331 alternately arranges the electrodes 331 and 31 having different electric potentials between the extending portions 331 and the first electrode finger films 31 disposed in the non-intersection regions RB, thereby forming electrostatic capacity. Meanwhile, since the extending portion 331 is formed on the support film 6 made of the dielectric material without a piezoelectric property, it does not excite the SAW.

In view of this, only the electrostatic capacity of a SAW resonator can be increased, and a capacitance ratio is increased compared with when no extending portion 331 is disposed, thereby ensuring a reduced effective electromechanical coupling coefficient.

When the extending portion 331 is formed on the piezoelectric substrate 11, the excitation of the SAW generated at the extending portion 331 generates the spurious response, and therefore, the SAW device may become inappropriate for being used as a resonator of a filter and a duplexer.

Figure 10:
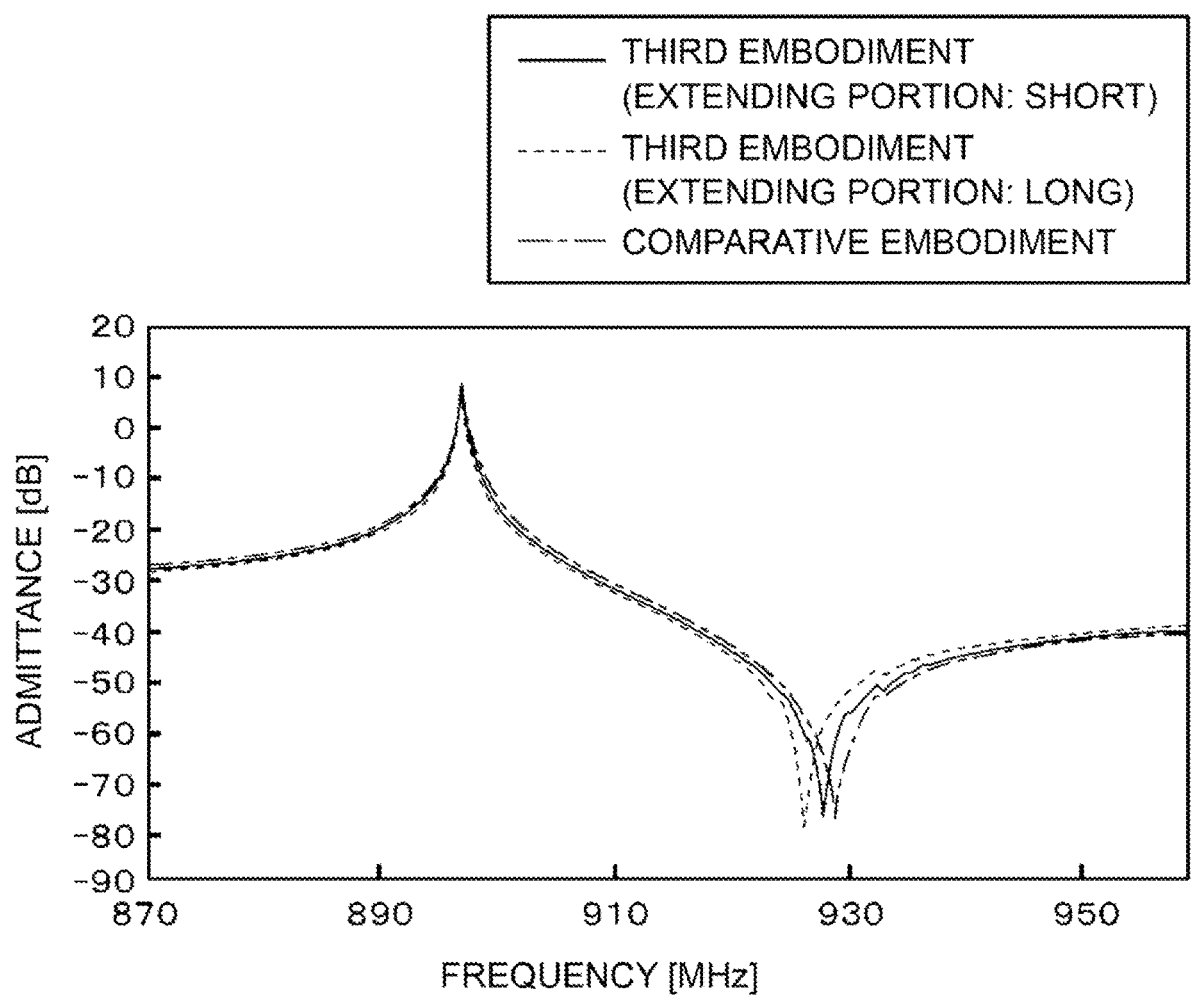
FIG. 10 is a frequency-admittance characteristic diagram of the SAW device according to the third embodiment.
Figure 11:
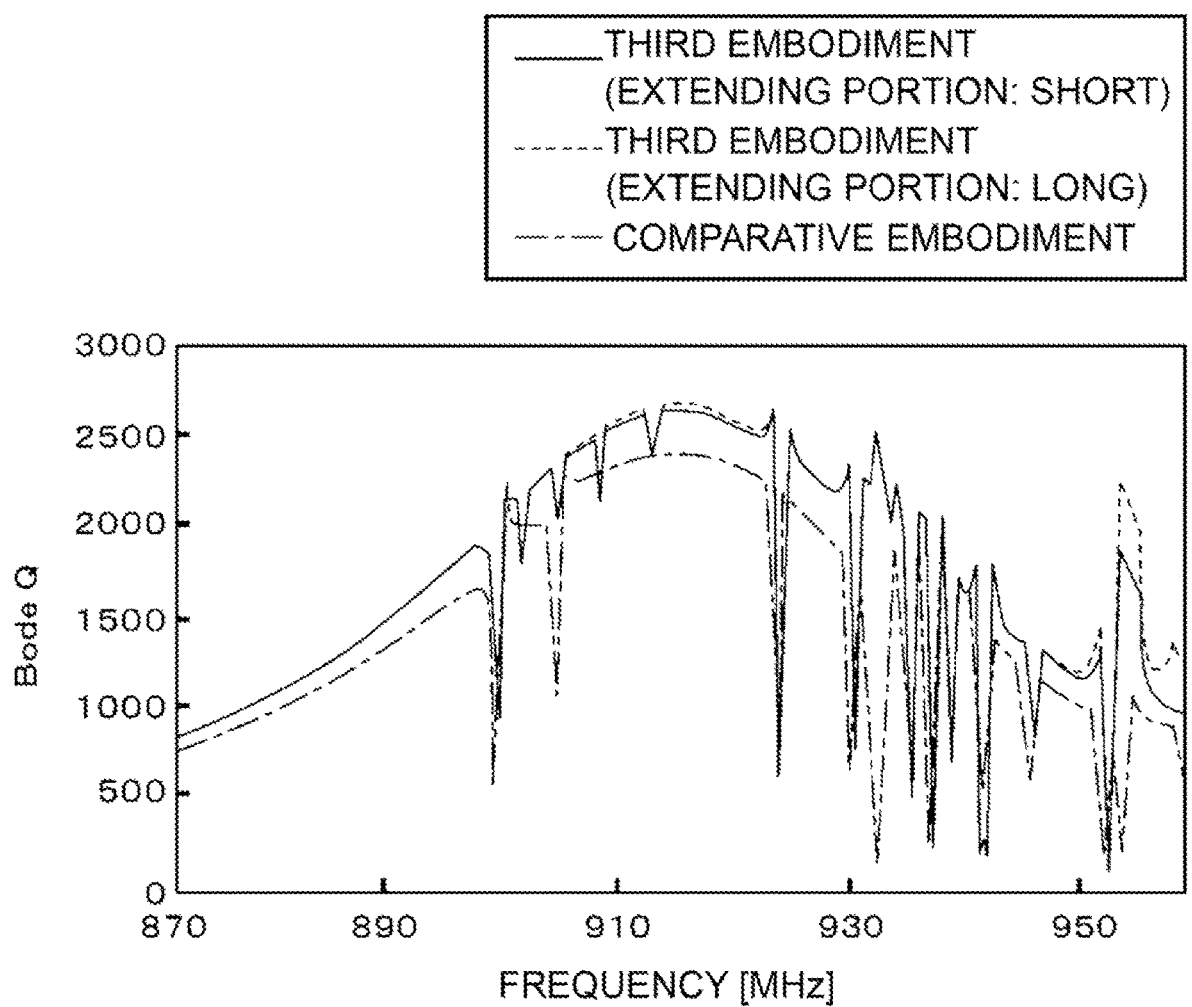
FIG. 11 is a frequency-Bode Q-value characteristic diagram of the SAW device according to the third embodiment.

FIG. 10 and FIG. 11 illustrate comparisons of characteristics between a model of the SAW device according to the third embodiment and the SAW device according to the comparative configuration illustrated in (a) and (b) of FIG. 2 by creating the model of the SAW device according to the third embodiment and performing the FEM analysis on it.

Except that a length of the extending portion 331 is changed to 6.4 µm (short) and 12.8 µm (long), each of the design variables is the same as those in the simulation model of the third embodiment.

According to the results illustrated in FIG. 10, it was confirmed that the SAW device according to the third embodiment, in which the extending portions 331 were disposed, each had an anti-resonance point moved to a resonance point side to show a steep transition characteristic and obtained a satisfactory characteristic with a reduced spurious response compared with the SAW device according to the comparative configuration. As the extending portion 331 increased in length, a tendency that the anti-resonance point further moves toward the resonance point side appeared.

The Bode Q-value was approximately 2700 in the SAW device according to the third embodiment irrespective of the length of the extending portion, and Bode Q had an improvement by approximately 300 compared with that of the conventional configuration, thereby obtaining a low loss SAW device.

In the SAW devices according to the respective embodiments described above using (a) to (d) of FIG. 1, (a) and (b) of FIG. 5, (a) and (b) of FIG. 6, and (a) and (b) of FIG. 9, in order to reduce influences of expansion and contraction associated with temperature change, a supporting substrate with a small thermal expansion rate may be stacked on a bottom surface side of the piezoelectric substrate 11. As the supporting substrate, silicon (Si), crystal ($SiO_2$), glass, diamond (C), and sapphire ($Al_2O_3$) can be exemplified. Furthermore, a dielectric material layer (for example, silicon dioxide) and a metal layer may be formed between the supporting substrate and the piezoelectric substrate 11.

Additionally, the method for making the thicknesses of the electrode fingers 3a and 3b mutually different between the non-intersection region RB and the intersection region ZAB is not limited to the case of using the method in which the first electrode finger film 31 and the second electrode finger film 32 having different thicknesses are connected.

For example, after forming a metal film with a uniform thickness and patterning the electrode fingers 3a and 3b, a part of the electrode fingers 3a and 3b in the non-intersection region RB may be partly etched to decrease the thicknesses of the electrode fingers 3a and 3b in the non-intersection region RB.

The SAW devices described above can be used as an electronic component as a single SAW device illustrated in (a) to (d) of FIG. 1, (a) and (b) of FIG. 5, (a) and (b) of FIG. 6, and (a) and (b) of FIG. 9. The piezoelectric substrate 11 may be widen in a longitudinal direction and a grating reflector may be disposed before and behind the IDT electrodes.

Furthermore, this SAW device is applicable to an elastic wave resonator and an elastic wave filter including the plurality of IDT electrodes on the common piezoelectric substrate 11.

The SAW device of the example can be used for any device having a filter function including a filter, a duplexer, and a quadplexer. The device can be built into a Power Amp Integrated Duplexer referred to as, for example, PAMiD, PAiD, and PAD, and a Diversity Front End Module referred to as, for example, DiFEM.

The above-described surface acoustic wave device may include the following configurations.

(a) The intersection region includes two end portion regions as regions including end portions of the electrode fingers when viewed along the arrangement direction of the plurality of electrode fingers, and the end portion regions are low acoustic velocity regions having a propagation velocity of surface acoustic wave slower than a propagation velocity of surface acoustic wave in the intersection region inside the end portion regions.

(b) In (a), the electrode fingers are configured by connecting a first electrode finger film disposed in the non-intersection region to a second electrode finger film that is disposed in the intersection region and has a thickness thicker than a thickness of the first electrode finger film, and in the end portion region, the low acoustic velocity region is formed by stacking and connecting a distal end portion as an end portion on an opposite side of an end portion connected to the busbar of the first electrode finger film and a base portion as an end portion on a side of the first electrode finger film of the second electrode finger film, and by stacking a distal end portion as an end portion on an opposite side of the base portion of the second electrode finger film included in the end portion region and a propagation velocity adjusting film for decreasing the propagation velocity of surface acoustic wave to a low speed with the increased thickness of the electrode finger.

(c) In (b), the first electrode finger film is formed on a support film made of a dielectric material formed in a region other than a formation region of the second electrode finger film on the piezoelectric substrate while the distal end portion of the first electrode finger film is stacked on an upper surface side of the base portion of the second electrode finger film, and the propagation velocity adjusting film is stacked on an upper surface side of the distal end portion of the second electrode finger film. Furthermore, the propagation velocity adjusting film includes an extending portion extended toward on the support film on a side of the non-intersection region.

(d) In (b) and (c), in the non-intersection region, a plurality of dummy electrode fingers is formed between end portions of the plurality of electrode fingers connected to the one busbar and the other busbar for each of the pair of busbars, and the plurality of dummy electrode fingers extend out from the other busbar away from the end portions. The dummy electrode finger has a thickness thinner than the thickness of the electrode finger in the intersection region.

(e) In (b) to (d), the first electrode finger film and the propagation velocity adjusting film have densities smaller than a density of the second electrode finger film.

(f) In at least a part of region on the upper surface side of the surface acoustic wave device in which the IDT electrodes are formed, a dielectric material film is formed. At this time, the piezoelectric substrate is $LiNbO_3$, and the dielectric film is constituted of a material selected from the dielectric material group consisting of silicon dioxide, silicon oxynitride, or fluorine-doped silicon dioxide that has frequency versus temperature characteristics with which a frequency changes in a direction opposite to a frequency versus temperature characteristic of the piezoelectric substrate.

(g) The piezoelectric substrate is $LiNbO_3$ and has a cut angle in an Euler angle ($\phi$, $\theta$, $\psi$) notation of $\phi$, $\psi=0°\pm10°$, and $\theta=38°\pm10°$.

With the surface acoustic wave device, since the thickness of the electrode finger in the non-intersection region outside the intersection region is configured to be thinner than the thickness of the electrode finger in the intersection region in the pair of IDT electrodes disposed on the piezoelectric substrate, a loss associated with scattering of a surface acoustic wave is reduced, thereby ensuring further increasing a Q-value.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device comprising:
    a piezoelectric substrate; and
    a pair of interdigital transducer electrodes (IDT electrodes),
    wherein the pair of IDT electrodes includes:
    a pair of busbars, formed on the piezoelectric substrate; and
    a plurality of electrode fingers that extend in a comb shape from each of the pair of busbars toward the opposing busbar,
    wherein the pair of IDT electrodes has an intersection region as a region where the plurality of electrode fingers connected to one busbar and the plurality of electrode fingers connected to another busbar are intersected when viewed along an arrangement direction of the plurality of electrode fingers, and
    one of the plurality of electrode fingers in a non-intersection region outside the intersection region has a thickness thinner than a thickness of one of the plurality of electrode fingers in the intersection region,
    wherein
    the intersection region includes two end portion regions as regions including end portions of the electrode fingers when viewed along the arrangement direction of the plurality of electrode fingers, and
    the two end portion regions are low acoustic velocity regions having a propagation velocity of surface acoustic wave slower than a propagation velocity of surface acoustic wave in the intersection region inside the two end portion regions,
    wherein
    the plurality of electrode fingers are configured by connecting a first electrode finger film disposed in the non-intersection region to a second electrode finger film that is disposed in the intersection region and has a thickness thicker than a thickness of the first electrode finger film, and
    in the end portion region, the low acoustic velocity region is formed by stacking and connecting a distal end portion as an end portion on an opposite side of an end portion connected to the busbar of the first electrode finger film and a base portion as an end portion on a side of the first electrode finger film of the second electrode finger film, and by stacking a distal end portion as an end portion on an opposite side of the base portion of the second electrode finger film included in the end portion region and a propagation velocity adjusting film for decreasing the propagation velocity of surface acoustic wave to a low speed with the increased thickness of the electrode fingers.

2. The surface acoustic wave device according to claim 1, wherein
    in at least a part of region on an upper surface side of the surface acoustic wave device in which the pair of IDT electrodes are formed, a dielectric material film is formed.

3. The surface acoustic wave device according to claim 2, wherein
    the piezoelectric substrate is LiNbO$_3$, and
    the dielectric film is constituted of a material selected from a dielectric material group consisting of silicon dioxide, silicon oxynitride, or fluorine-doped silicon dioxide that has frequency versus temperature characteristics with which a frequency changes in a direction opposite to a frequency versus temperature characteristic of the piezoelectric substrate.

4. The surface acoustic wave device according to claim 1, wherein
    the first electrode finger film is formed on a support film made of a dielectric material formed in a region other than a formation region of the second electrode finger film on the piezoelectric substrate while the distal end portion of the first electrode finger film is stacked on an upper surface side of the base portion of the second electrode finger film, and
    the propagation velocity adjusting film is stacked on an upper surface side of the distal end portion of the second electrode finger film.

5. The surface acoustic wave device according to claim 4, wherein
    the propagation velocity adjusting film includes an extending portion extended toward on the support film on a side of the non-intersection region.

6. The surface acoustic wave device according to claim 1, wherein
    in the non-intersection region, a plurality of dummy electrode fingers are formed between end portions of the plurality of electrode fingers connected to the one busbar and the other busbar for each of the pair of busbars, the plurality of dummy electrode fingers extending out from the other busbar away from the end portions.

7. The surface acoustic wave device according to claim 6, wherein
    one of the plurality of dummy electrode fingers has a thickness thinner than the thickness of one of the plurality of electrode fingers in the intersection region.

8. The surface acoustic wave device according to claim 1, wherein
    the first electrode finger film and the propagation velocity adjusting film have densities smaller than a density of the second electrode finger film.

9. The surface acoustic wave device according to claim 1, wherein
    the piezoelectric substrate is LiNbO$_3$ and has a cut angle in an Euler angle ($\varphi$, $\theta$, $\psi$) notation of $\varphi$, $\psi=0°\pm10°$, and $\theta=38°\pm10°$.

* * * * *